(12) United States Patent
Chang et al.

(10) Patent No.: US 8,773,179 B2
(45) Date of Patent: Jul. 8, 2014

(54) INPUT RECEIVER AND OPERATION METHOD THEREOF

(71) Applicant: Etron Technology, Inc., Hsinchu (TW)

(72) Inventors: Yi-Hao Chang, Hsinchu (TW);
Shih-Hsing Wang, Hsinchu (TW);
Wen-Tung Yang, Hsinchu (TW);
Yen-An Chang, Miaoli County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 13/789,691

(22) Filed: Mar. 8, 2013

(65) Prior Publication Data

US 2013/0234766 A1 Sep. 12, 2013

Related U.S. Application Data

(60) Provisional application No. 61/608,661, filed on Mar. 9, 2012.

(51) Int. Cl.
*H03L 7/00* (2006.01)
*H03K 19/00* (2006.01)
*H03K 3/012* (2006.01)

(52) U.S. Cl.
CPC ............ *H03K 3/012* (2013.01); *H03K 19/0016* (2013.01)
USPC ............................ 327/142; 327/143; 327/198

(58) Field of Classification Search
USPC .......................................... 327/142, 143, 198
See application file for complete search history.

(56) References Cited

U.S. PATENT DOCUMENTS

| | | | |
|---|---|---|---|
| 7,248,085 B2* | 7/2007 | Jung | 327/143 |
| 7,602,222 B2* | 10/2009 | Pyeon et al. | 327/143 |
| 8,270,243 B2* | 9/2012 | Lee | 365/222 |
| 8,350,610 B2* | 1/2013 | Mosalikanti et al. | 327/198 |
| 8,487,672 B2* | 7/2013 | Itoh | 327/142 |
| 2012/0019285 A1* | 1/2012 | Mosalikanti et al. | 327/1 |

* cited by examiner

*Primary Examiner* — Brandon S Cole
(74) *Attorney, Agent, or Firm* — Winston Hsu; Scott Margo

(57) ABSTRACT

An input receiver includes a first input receiving unit, a second input receiving unit, a delay unit, and a first logic unit. The first input receiving unit receives an inverse wake-up signal, an external clock enable signal, a first voltage, and a reference signal, and then generates a first enable signal according to the external clock enable signal and the reference signal. The second input receiving unit receives the external clock enable signal, the first voltage, and an inverse enable voltage, and then generates a second enable signal as its output according to the external clock enable signal. The delay unit generates a wake-up signal according to the second enable signal. The first logic unit receives the wake-up signal and the first enable signal, and then generates an internal clock enable signal according to the wake-up signal and the first enable signal.

29 Claims, 12 Drawing Sheets

INPUT RECEIVER AND OPERATION METHOD THEREOF

CROSS REFERENCE TO RELATED APPLICATIONS

This application claims the benefit of U.S. Provisional Application No. 61/608,661, filed on Mar. 9, 2012 and entitled "High Performance and Low Power Clock Enable Input Receiver Circuitry," the contents of which are incorporated herein by reference.

BACKGROUND OF THE INVENTION

1. Field of the Invention

The present invention relates an input receiver and an operation method thereof, and particularly to an input receiver and an operation method thereof that can have lower power consumption when the input receiver enters a power down mode, and have a good setup time, a good hold time, a shorter response time, and better noise immunity when the input receiver enters or leaves the power down mode.

2. Description of the Prior Art

Please refer to FIG. 1. FIG. 1 is a diagram illustrating an input receiving circuit 102 for receiving an external clock enable signal XCKE and an enable register 104 according to the prior art. As shown in FIG. 1, when the external clock enable signal XCKE is changed from high to low, an internal clock enable signal ICKE outputted by the input receiving circuit 102 can be also immediately changed from high to low, and the enable register 104 can keep a latch clock enable signal LCKE outputted thereof low according to an inner clock ICLK, resulting in a system buffer (e.g. a clock buffer, an address buffer, a command buffer, or a data buffer of a dynamic random access memory) receiving the latch clock enable signal LCKE being turned off. That is to say, the system enters a power down mode.

In addition, when the external clock enable signal is changed from low to high, the internal clock enable signal ICKE outputted by the input receiving circuit 102 can be also immediately changed from low to high, and the enable register 104 can keep the latch clock enable signal LCKE outputted thereof high according to the inner clock ICLK, resulting in the system buffer (e.g. the clock buffer, the address buffer, the command buffer, or the data buffer of a dynamic random access memory) receiving the latch clock enable signal LCKE being turned on. That is to say, the system leaves the power down mode.

In the prior art, the input receiving circuit 102 has either larger power consumption, or worse noise immunity. Therefore, how to design a better input receiving circuit becomes an important issue for an integrated circuit designer.

SUMMARY OF THE INVENTION

An embodiment provides an input receiver. The input receiver includes a first input receiving unit, a second input receiving unit, a delay unit, and a first logic unit. The first input receiving unit is used for receiving an inverse wake-up signal, an external clock enable signal, a first voltage, and a reference signal, and generating and outputting a first enable signal according to the external clock enable signal and the reference signal. The second input receiving unit is used for receiving the external clock enable signal, the first voltage, and an inverse enable voltage, and generating and outputting a second enable signal according to the external clock enable signal. The delay unit is coupled to the second input receiving unit for generating a wake-up signal according to the second enable signal. The first logic unit is coupled to the first input receiving unit and the delay unit for receiving the first enable signal and the wake-up signal, and generating an internal clock enable signal according to the first enable signal and the wake-up signal.

Another embodiment provides an operation method of an input receiver, where the input receiver includes a first input receiving unit, a second input receiving unit, a delay unit, and a first logic unit. The operation method includes the second input receiving unit receiving an external clock enable signal, a first voltage, and an inverse enable voltage, where the external clock enable signal is changed from low to high; the second input receiving unit generating and outputting a second enable signal according to the external clock enable signal; the delay unit generating a wake-up signal according to the second enable signal; the first input receiving unit being turned on according to the inverse wake-up signal; the first logic unit receiving the wake-up signal and a first enable signal; and the first logic unit generating an internal clock enable signal according to the wake-up signal and the first enable signal.

Another embodiment provides an operation method of an input receiver, where the input receiver includes a first input receiving unit, a second input receiving unit, a delay unit, and a first logic unit. The operation method includes the first input receiving unit receiving an external clock enable signal, a first voltage, an inverse wake-up signal, and a reference signal, wherein the external clock enable signal is changed from high to low; the first input generating a first enable signal according to the external clock enable signal and the reference signal; the second input receiving unit receiving the external clock enable signal, the first voltage, and an inverse enable voltage; the second input receiving unit generating and outputting a second enable signal according to the external clock enable signal; the delay unit belatedly generating a wake-up signal according to the second enable signal; the first logic unit receiving the first enable signal and the wake-up signal; the first logic unit generating an internal clock enable signal according to the first enable signal and the wake-up signal; and the first input receiving unit being turned off according to the inverse wake-up signal.

The present invention provides an input receiver and an operation method thereof. The present invention has advantages as follows: first, after the present invention enters a power down mode, because a first input receiving unit and an inner clock generator can be turned off, and a second input receiving unit has low power consumption, compared to the prior art, power consumption of the present invention is lower; second, when the present invention enters the power down mode, because of the delay of the second enable signal, the output of the first logic unit is determined by the first enable signal, and this characteristic makes the present invention has a good setup time, a good hold time and better noise immunity while entering power down mode; third, when the present invention leaves the power down mode, because the first input receiving unit can be quickly changed from turning-off to turning-on, the internal clock enable signal outputted by the present invention has shorter response time and better noise immunity.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
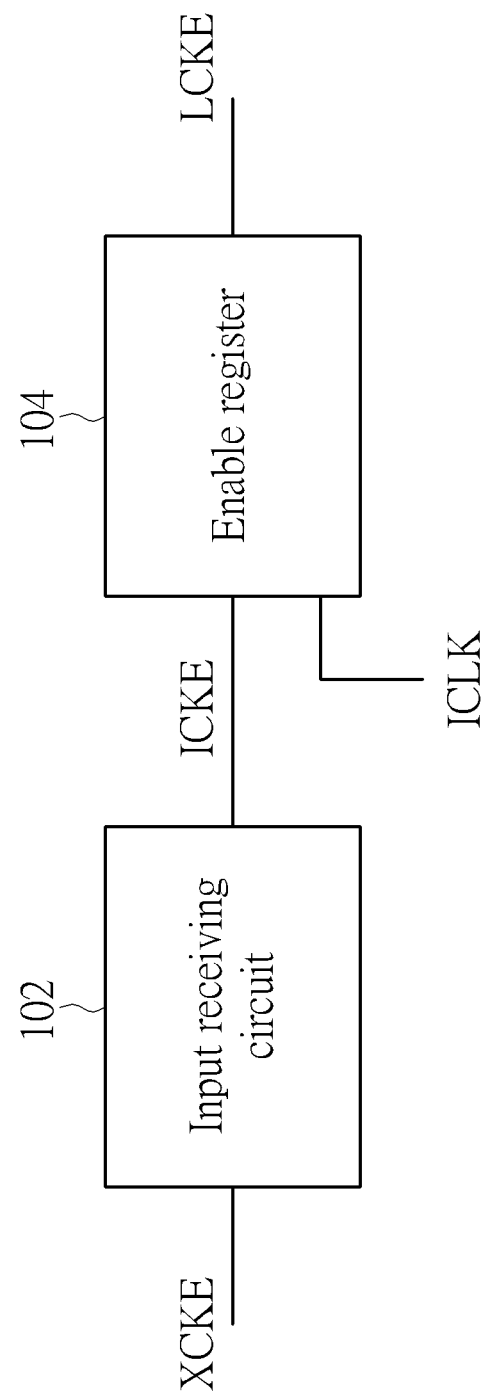
FIG. 1 is a diagram illustrating an input receiving circuit for receiving an external clock enable signal and an enable register according to the prior art.
Figure 2:
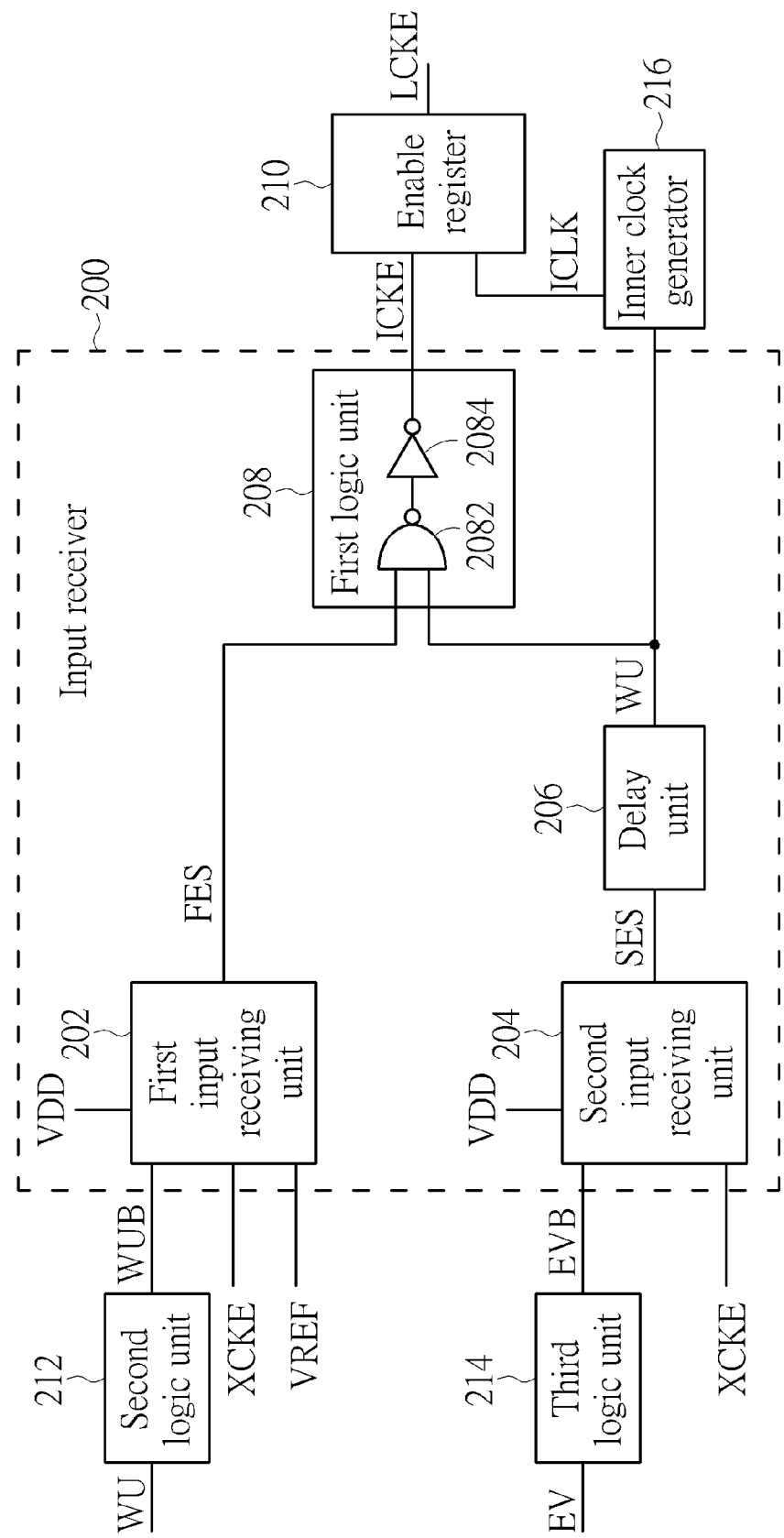
FIG. 2 is a diagram illustrating an input receiver according to an embodiment.

Please refer to FIG. 2. FIG. 2 is a diagram illustrating an input receiver 200 according to an embodiment. The input receiver 200 includes a first input receiving unit 202, a second input receiving unit 204, a delay unit 206, and a first logic unit 208. The first input receiving unit 202 is used for receiving an inverse wake-up signal WUB, an external clock enable signal XCKE, a first voltage VDD, and a reference signal VREF, and generating and outputting a first enable signal FES according to the external clock enable signal XCKE and the reference signal VREF. The second input receiving unit 204 is used for receiving the external clock enable signal XCKE, the first voltage VDD, and an inverse enable voltage EVB, and generating and outputting a second enable signal SES according to the external clock enable signal XCKE. The delay unit 206 is coupled to the second input receiving unit 204 for generating a wake-up signal WU according to the second enable signal SES. The first logic unit 208 is coupled to the first input receiving unit 202 and the delay unit 206 for receiving the first enable signal FES and the wake-up signal WU, and generating an internal clock enable signal ICKE according to the first enable signal FES and the wake-up signal WU. As shown in FIG. 2, the first logic unit 208 includes an NAND gate 2082 and an inverter 2084. The NAND gate 2082 has a first terminal coupled to the first input receiving unit 202 for receiving the first enable signal FES, a second terminal coupled to the delay unit 206 for receiving the wake-up signal WU, and a third terminal. The inverter 2084 has a first terminal coupled to the third terminal of the NAND gate 2082, and a second terminal for outputting the internal clock enable signal ICKE. But, the present invention is not limited to the first logic unit 208 including the NAND gate 2082 and the inverter 2084. In addition, as shown in FIG. 2, the internal clock enable signal ICKE is transmitted to an enable register 210. In addition, the inverse wake-up signal WUB is generated by the wake-up signal WU passing a second logic unit 212 (e.g. an inverter), and the inverse enable voltage EVB is generated by an enable voltage EV passing a third logic unit 214 (e.g. an inverter).

Figure 3:
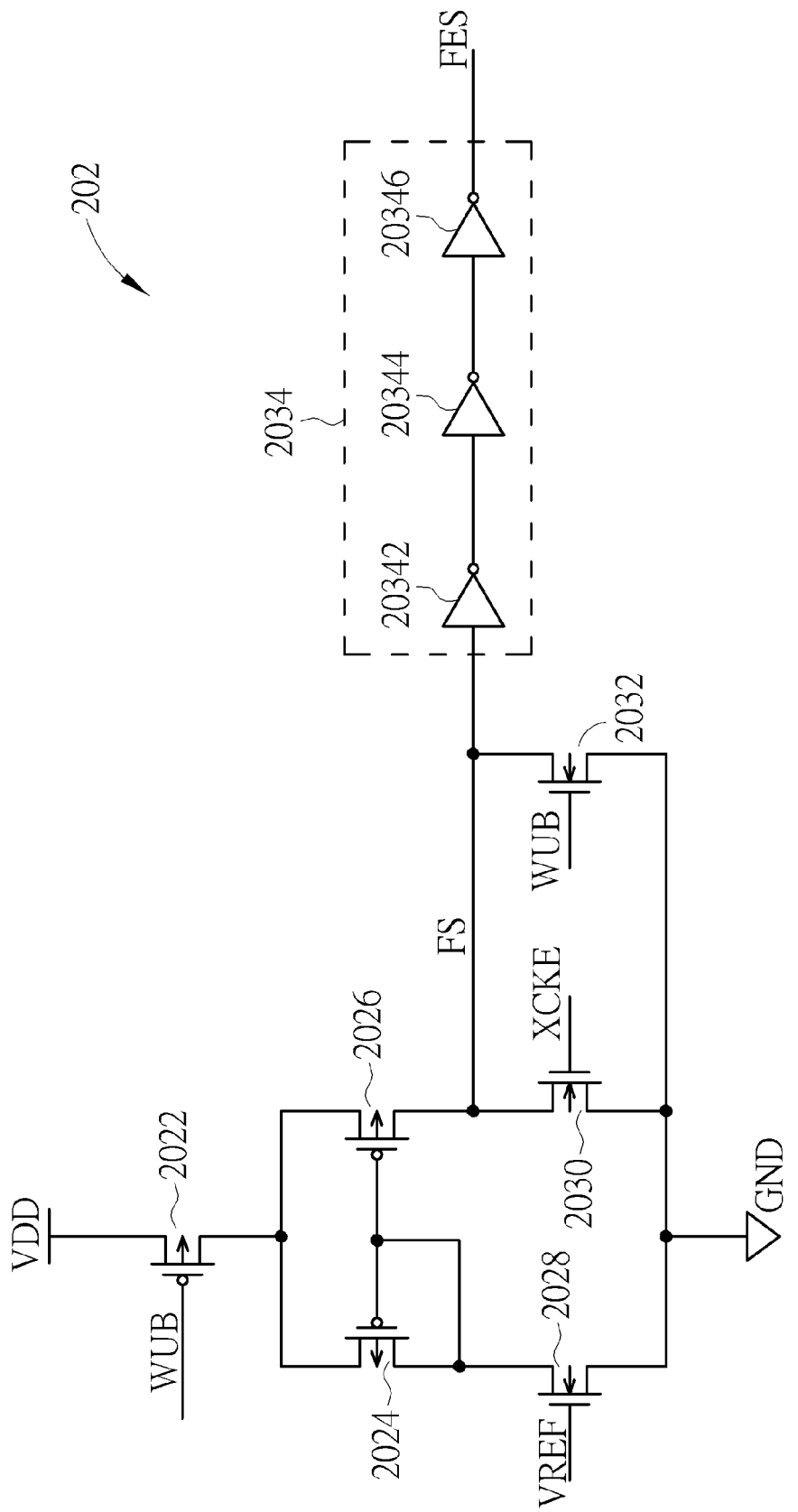
FIG. 3 is a diagram illustrating the first input receiving unit.
Figure 4:
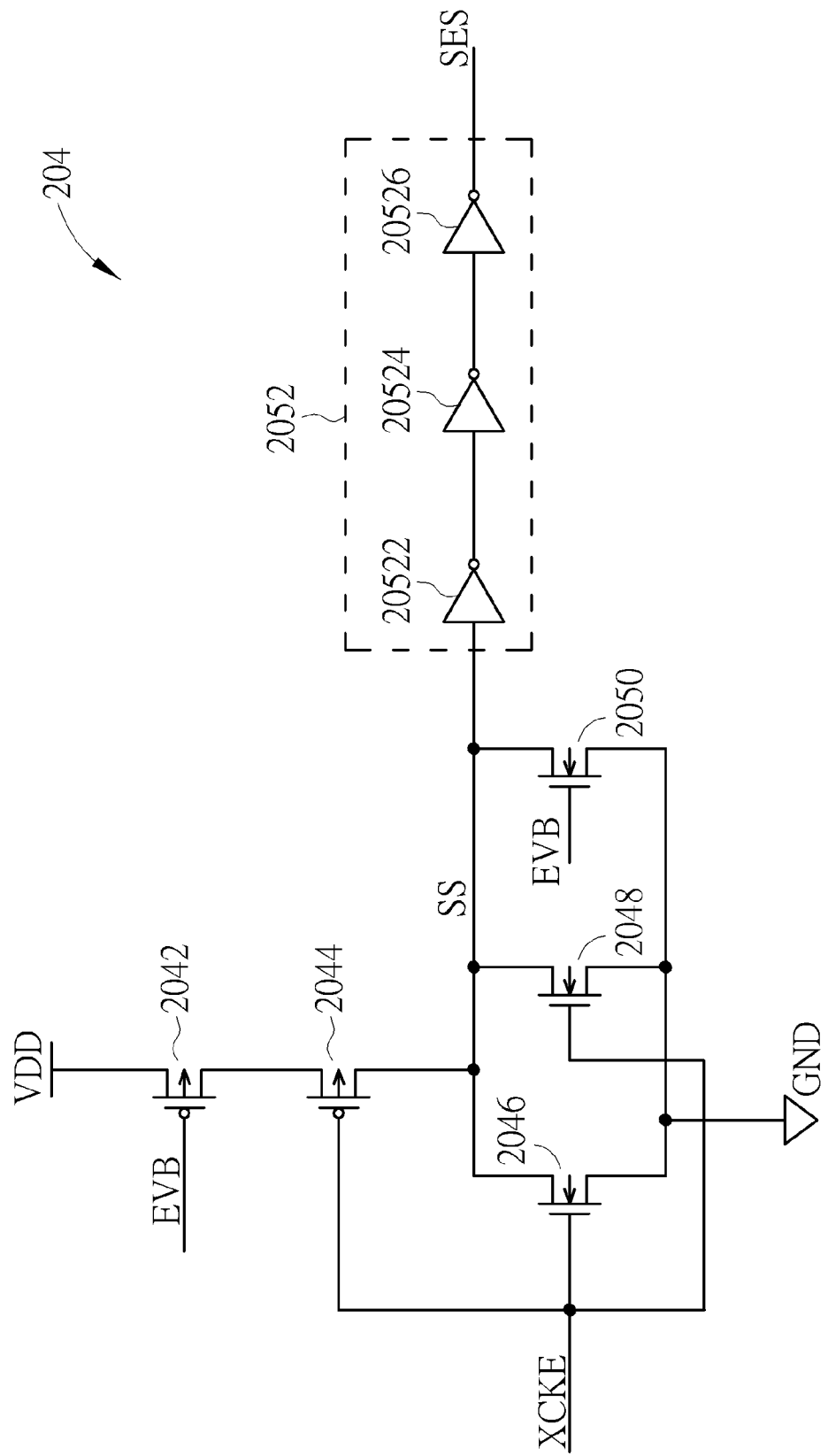
FIG. 4 is a diagram illustrating the second input receiving unit.
Figure 5:
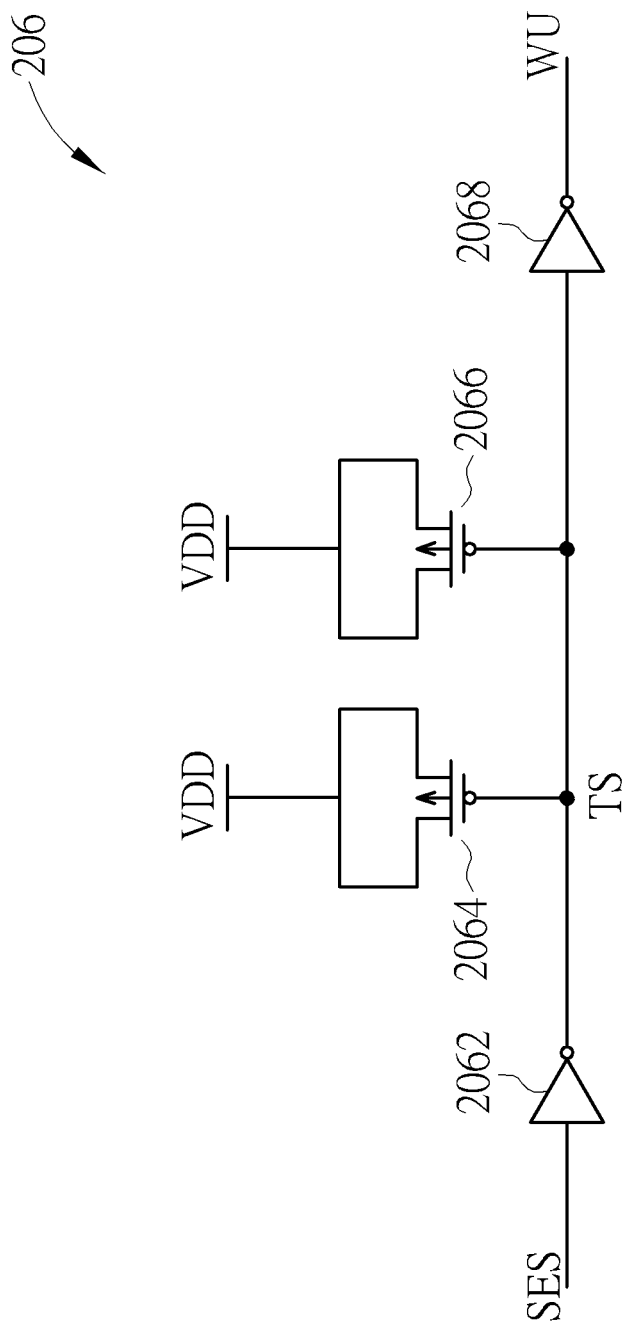
FIG. 5 is a diagram illustrating the delay unit.

Please refer to FIG. 3, FIG. 4, and FIG. 5. FIG. 3 is a diagram illustrating the first input receiving unit 202, FIG. 4 is a diagram illustrating the second input receiving unit 204, and FIG. 5 is a diagram illustrating the delay unit 206. As shown in FIG. 3, the first input receiving unit 202 includes a first P-type metal-oxide-semiconductor transistor 2022, a second P-type metal-oxide-semiconductor transistor 2024, a third P-type metal-oxide-semiconductor transistor 2026, a first N-type metal-oxide-semiconductor transistor 2028, a second N-type metal-oxide-semiconductor transistor 2030, a third N-type metal-oxide-semiconductor transistor 2032, and an inner logic unit 2034. The first P-type metal-oxide-semiconductor transistor 2022 has a first terminal for receiving the first voltage VDD, a second terminal for receiving the inverse wake-up signal WUB, and a third terminal. The second P-type metal-oxide-semiconductor transistor 2024 has a first terminal coupled to the third terminal of the first P-type metal-oxide-semiconductor transistor 2022, a second terminal, and a third terminal coupled to the second terminal of the second P-type metal-oxide-semiconductor transistor 2024. The third P-type metal-oxide-semiconductor transistor 2026 has a first terminal coupled to the third terminal of the first P-type metal-oxide-semiconductor transistor 2022, a second terminal coupled to the second terminal of the second P-type metal-oxide-semiconductor transistor 2024, and a third terminal for outputting a first signal FS. The first N-type metal-oxide-semiconductor transistor 2028 has a first terminal coupled to the third terminal of the second P-type metal-oxide-semiconductor transistor 2024, a second terminal for receiving the reference signal VREF, and a third terminal coupled to ground GND. The second N-type metal-oxide-semiconductor transistor 2030 has a first terminal coupled to the third terminal of the third P-type metal-oxide-semiconductor transistor 2026, a second terminal for receiving the external clock enable signal XCKE, and a third terminal coupled to the ground GND. The third N-type metal-oxide-semiconductor transistor 2032 has a first terminal coupled to the third terminal of the third P-type metal-oxide-semiconductor transistor 2026, a second terminal for receiving the inverse wake-up signal WUB, and a third terminal coupled to the ground GND. The inner logic unit 2034 includes a first inverter 20342, a second inverter 20344, and a third inverter 20346. The first inverter 20342 has a first terminal coupled to the third terminal of the third P-type metal-oxide-semiconductor transistor 2026 for receiving the first signal FS, and a second terminal. The second inverter 20344 has a first terminal coupled to the second terminal of the first inverter 20342, and a second terminal. The third inverter 20346 has a first terminal coupled to the second terminal of the second inverter 20344, and a second terminal for outputting the first enable signal FES. That is to say, the inner logic unit 2034 is used for reversing the first signal FS to generate and output the first enable signal FES. As shown in FIG. 3, because the first N-type metal-oxide-semiconductor transistor 2028 and the second N-type metal-oxide-semiconductor transistor 2030 act as a differential pair, the first input receiving unit 202 can make the first enable signal FES follow variation of the external clock enable signal XCKE when the inverse wake-up signal WUB is low. That is to say, when the inverse wake-up signal WUB is low and the external clock enable signal XCKE is high, the first enable signal FES is high; and when the inverse wake-up signal WUB is low and the external clock enable signal XCKE is low, the first enable signal FES is low. In addition, when the inverse wake-up signal WUB is high, the differential pair composed of the first N-type metal-oxide-semiconductor transistor 2028 and the second N-type metal-oxide-semiconductor transistor 2030 is turned off and the third N-type metal-oxide-semiconductor transistor 2032 is turned on, resulting in the first signal FS being pulled down to potential of the ground GND. Meanwhile, the first input receiving unit 202 can keep the first enable signal FES high.

As shown in FIG. 4, the second input receiving unit 204 includes a first P-type metal-oxide-semiconductor transistor 2042, a second P-type metal-oxide-semiconductor transistor 2044, a first N-type metal-oxide-semiconductor transistor 2046, a second N-type metal-oxide-semiconductor transistor 2048, a third N-type metal-oxide-semiconductor transistor 2050, and an inner logic unit 2052. The first P-type metal-oxide-semiconductor transistor 2042 has a first terminal for receiving the first voltage VDD, a second terminal for receiving the inverse enable voltage EVB, and a third terminal. The second P-type metal-oxide-semiconductor transistor 2044 has a first terminal coupled to the third terminal of the first P-type metal-oxide-semiconductor transistor 2042, a second terminal for receiving the external clock enable signal XCKE, and a third terminal for outputting a second signal SS. The first N-type metal-oxide-semiconductor transistor 2046 has a first terminal coupled to the third terminal of the second P-type metal-oxide-semiconductor transistor 2044, a second terminal for receiving the external clock enable signal XCKE, and a third terminal coupled to the ground GND. The second N-type metal-oxide-semiconductor transistor 2048 has a first terminal coupled to the third terminal of the second P-type metal-oxide-semiconductor transistor 2044, a second terminal for receiving the external clock enable signal XCKE, and a third terminal coupled to the ground GND. The third N-type metal-oxide-semiconductor transistor 2050 has a first terminal coupled to the third terminal of the second P-type metal-oxide-semiconductor transistor 2044, a second terminal for receiving the inverse enable voltage EVB, and a third terminal coupled to the ground GND. The inner logic unit 2052 includes a first inverter 20522, a second inverter 20524, and a third inverter 20526. The first inverter 20522 has a first terminal for receiving the second signal SS, and a second terminal. The second inverter 20524 has a first terminal coupled to the second terminal of the first inverter 20522, and a second terminal. The third inverter 20526 has a first terminal coupled to the second terminal of the second inverter 20524, and a second terminal for outputting the second enable signal SES. That is to say, the inner logic unit 2052 is used for reversing the second signal SS to generate and output the enable signal SES. As shown in FIG. 4, because the second P-type metal-oxide-semiconductor transistor 2044, the first N-type metal-oxide-semiconductor transistor 2046, and the second N-type metal-oxide-semiconductor transistor 2048 act as an inverter, the second input receiving unit 204 can make the second enable signal SES follow the variation of the external clock enable signal XCKE when the inverse enable voltage EVB is low. That is to say, when the inverse enable voltage EVB is low and the external clock enable signal XCKE is high, the second enable signal SES is high; and when the inverse enable voltage EVB is low and the external clock enable signal XCKE is low, the second enable signal SES is low. In addition, when the inverse enable voltage EVB is high, the inverter composed of the second P-type metal-oxide-semiconductor transistor 2044, the first N-type metal-oxide-semiconductor transistor 2046, and the second N-type metal-oxide-semiconductor transistor 2048 is turned off and the third N-type metal-oxide-semiconductor transistor 2050 is turned on, resulting in the second signal SS being pulled down to the potential of the ground GND. Meanwhile, the second input receiving unit 204 can keep the second enable signal SES high. In addition, because the enable voltage EV is used for making the second input receiving unit 204 always be turned on, the enable voltage EV can also be equal to the first voltage VDD in another embodiment of the present invention.

As shown in FIG. 5, the delay unit 206 includes a first inverter 2062, a first P-type metal-oxide-semiconductor transistor 2064, a second P-type metal-oxide-semiconductor transistor 2066, and a second inverter 2068, where the first P-type metal-oxide-semiconductor transistor 2064 and the second P-type metal-oxide-semiconductor transistor 2066 act as delay capacitors. But, the present invention is not limited to delay unit 206 including the first P-type metal-oxide-semiconductor transistor 2064 and the second P-type metal-oxide-semiconductor transistor 2066. That is to say, the delay unit 206 can include at least one P-type metal-oxide-semiconductor transistor. The first inverter 2062 has a first terminal coupled to the second input receiving unit 204 for receiving the second enable signal SES, and a second terminal. The first P-type metal-oxide-semiconductor transistor 2064 has a first terminal for receiving the first voltage VDD, a second terminal coupled to the second terminal of the first inverter 2062, and a third terminal coupled to the first terminal of the first P-type metal-oxide-semiconductor transistor 2064. The second P-type metal-oxide-semiconductor transistor 2066 has a first terminal for receiving the first voltage VDD, a second terminal coupled to the second terminal of the first inverter 2062, and a third terminal coupled to the first terminal of the second P-type metal-oxide-semiconductor transistor 2066. The second inverter 2068 has a first terminal coupled to the second terminal of the first inverter 2062, and a second terminal for outputting the wake-up signal WU. As shown in FIG. 5, when the second enable signal SES is changed from high to low, a third signal TS is changed from low to high, so the first P-type metal-oxide-semiconductor transistor 2064 and the second P-type metal-oxide-semiconductor transistor 2066 are changed from turning-on to turning-off (that is, the delay capacitors are changed from turning-on to turning-off) during the third signal TS being changed from low to high, resulting in variation of the wake-up signal WU lagging variation of the second enable signal SES for a predetermined time. That is to say, the variation of the wake-up signal WU also lags variation of the first enable signal FES for the predetermined time. When the second enable signal SES is changed from low to high, the third signal TS is changed from high to low, so the first P-type metal-oxide-semiconductor transistor 2064 and the second P-type metal-oxide-semiconductor transistor 2066 are changed from turning-off to turning-on during the third signal TS being changed from high to low, resulting in the variation of the wake-up signal WU synchronizing with the variation of the second enable signal SES. That is to say, the variation of the wake-up signal WU also synchronizes with the variation of the first enable signal FES.

As shown in FIG. 2, FIG. 3, FIG. 4, and FIG. 5, when the external clock enable signal XCKE is changed from low to high and the enable voltage EV is high, the second enable signal SES is changed from low to high. Because the second enable signal SES is changed from low to high, the wake-up signal WU generated by the delay unit 206 synchronizes with the variation of the second enable signal SES. That is to say, the wake-up signal WU is changed from low to high, resulting in the first input receiving unit 202 being waked up, where the first enable signal FES is kept high according to the low wake-up signal WU during turning-off of the first input receiving unit 202. Therefore, when the wake-up signal WU is changed from low to high, the first logic unit 208 can immediately generate and output the high internal clock enable signal ICKE to the enable register 210 according to the high wake-up signal WU and the high first enable signal FES. Therefore, the enable register 210 can keep a latch clock enable signal LCKE outputted thereof high according to an inner clock ICLK, resulting in a system buffer (e.g. a clock buffer, an address buffer, a command buffer, or a data buffer of a dynamic random access memory) receiving the latch clock enable signal LCKE being turned on. That is to say, a system leaves a power down mode, where the inner clock ICLK is generated by an inner clock generator 216. In addition, after the wake-up signal WU is changed from low to high, the first input receiving unit 202 can be turned on to operate normally again.

When the external clock enable signal XCKE is changed from high to low and the enable voltage EV is high, the second enable signal SES is changed from high to low. Because the second enable signal SES is changed from high to low, the variation of the wake-up signal WU generated by the delay unit 206 lags the variation of the second enable signal SES. That is to say, the wake-up signal WU being changed from high to low lags the first enable signal FES being changed from high to low. Thus, the first logic unit 208 does not mistake, and can immediately generate and output the low internal clock enable signal ICKE to the enable register 210 according to the low first enable signal FES. Therefore, the enable register 210 can keep the latch clock enable signal LCKE outputted thereof low according to the inner clock ICLK, resulting in the system buffer (e.g. the clock buffer, the address buffer, the command buffer, or the data buffer of the dynamic random access memory) receiving the latch clock enable signal LCKE being turned off. That is to say, the system enters the power down mode. In addition, because the wake-up signal WU being changed from high to low lags the first enable signal FES being changed from high to low, the low wake-up signal WU can turn off the first input receiving unit 202 and the inner clock generator 216 after the enable register 210 keeps the latch clock enable signal LCKE outputted thereof low. Therefore, the system can save more power during the system entering the power down mode. In addition, as shown in FIG. 3, after the wake-up signal WU is low, the third N-type metal-oxide-semiconductor transistor 2032 is turned on, resulting in the first enable signal FES being kept high. Thus, when the external clock enable signal XCKE is changed from low to high, the first logic unit 208 can immediately generate and output the low internal clock enable signal ICKE to the enable register 210 according to the high first enable signal FES and the high wake-up signal WU to make the system quickly leave the power down mode.

Figure 6:
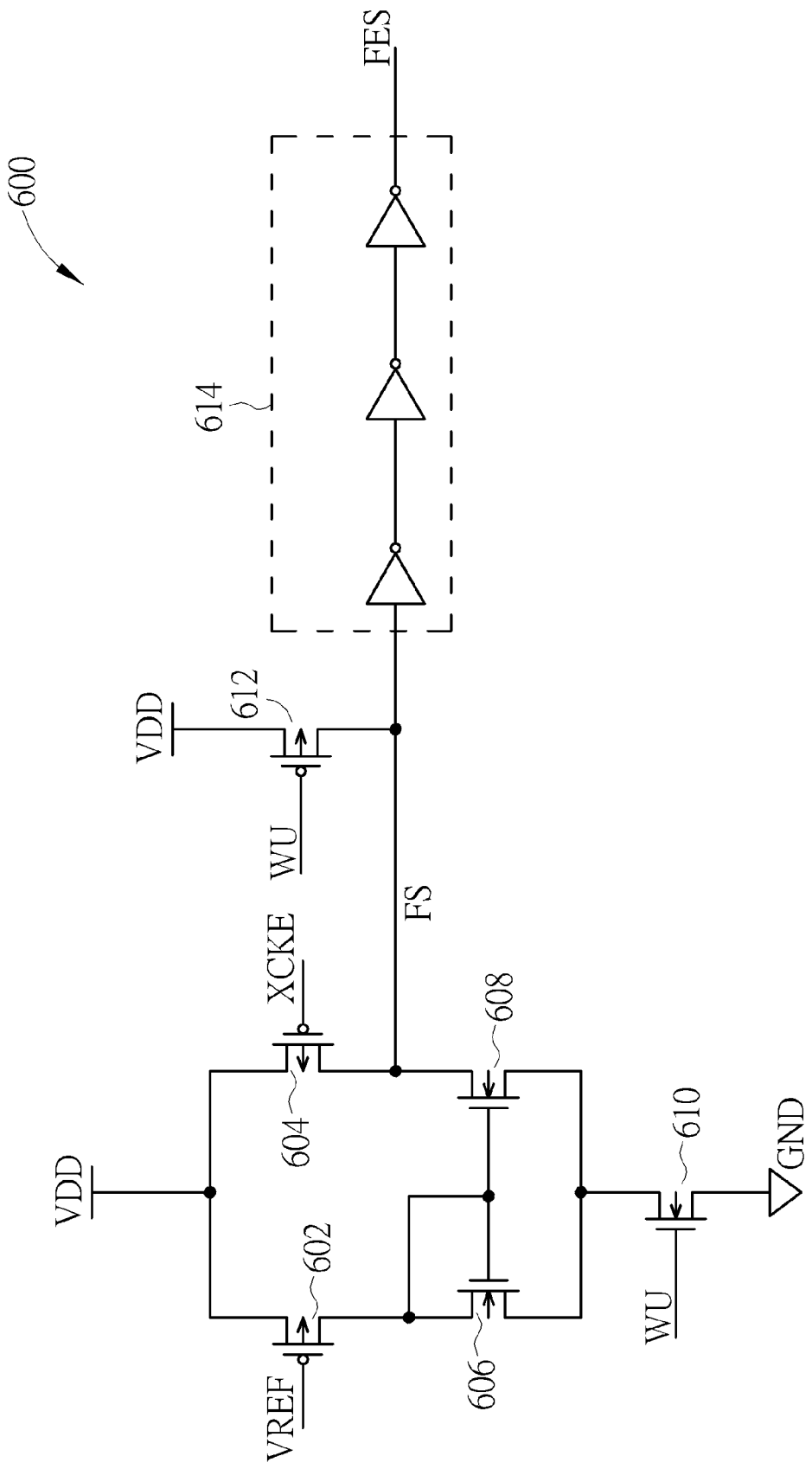
FIG. 6 is a diagram illustrating a first input receiving unit according to another embodiment.
Figure 7:
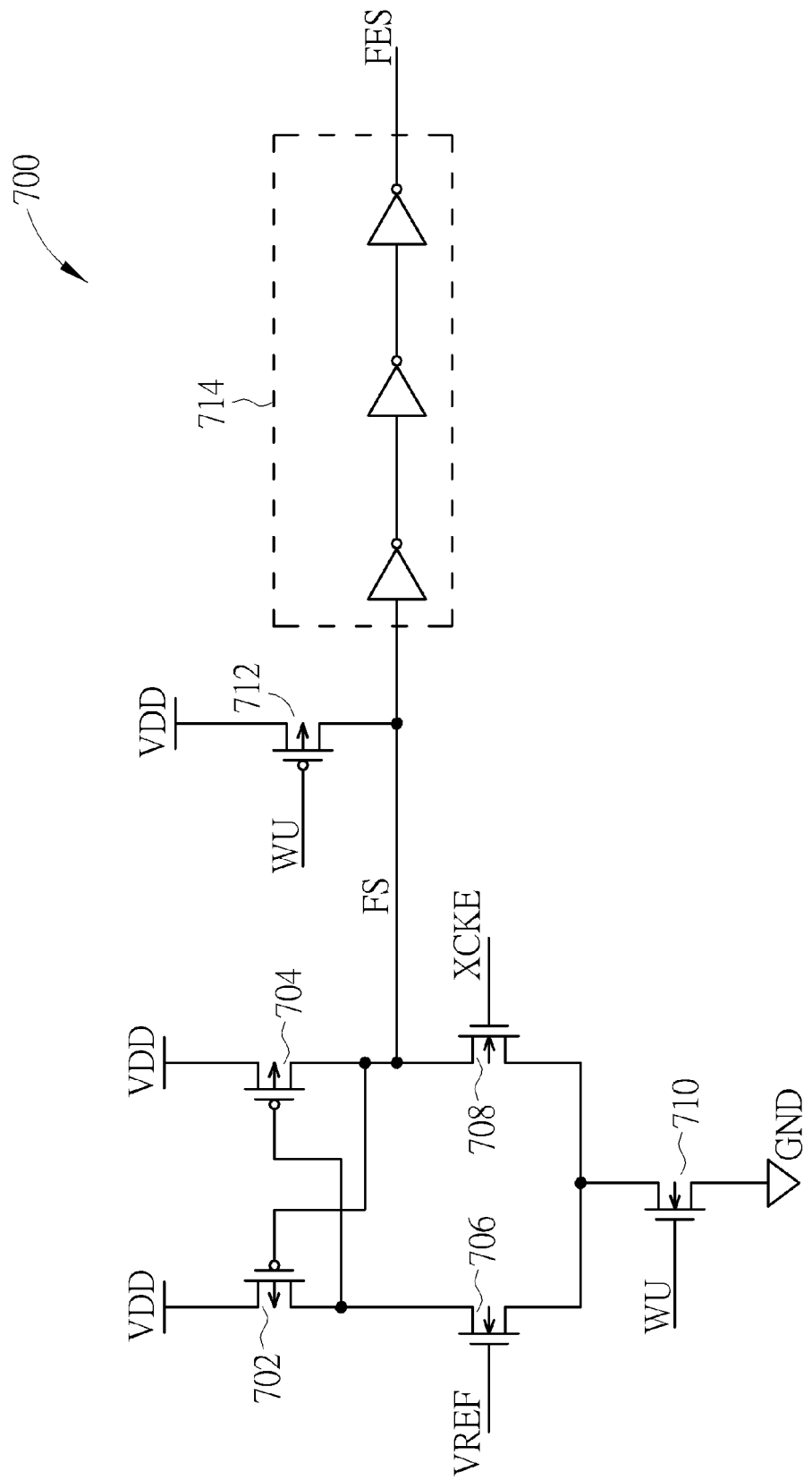
FIG. 7 is a diagram illustrating a first input receiving unit according to another embodiment.
Figure 8:
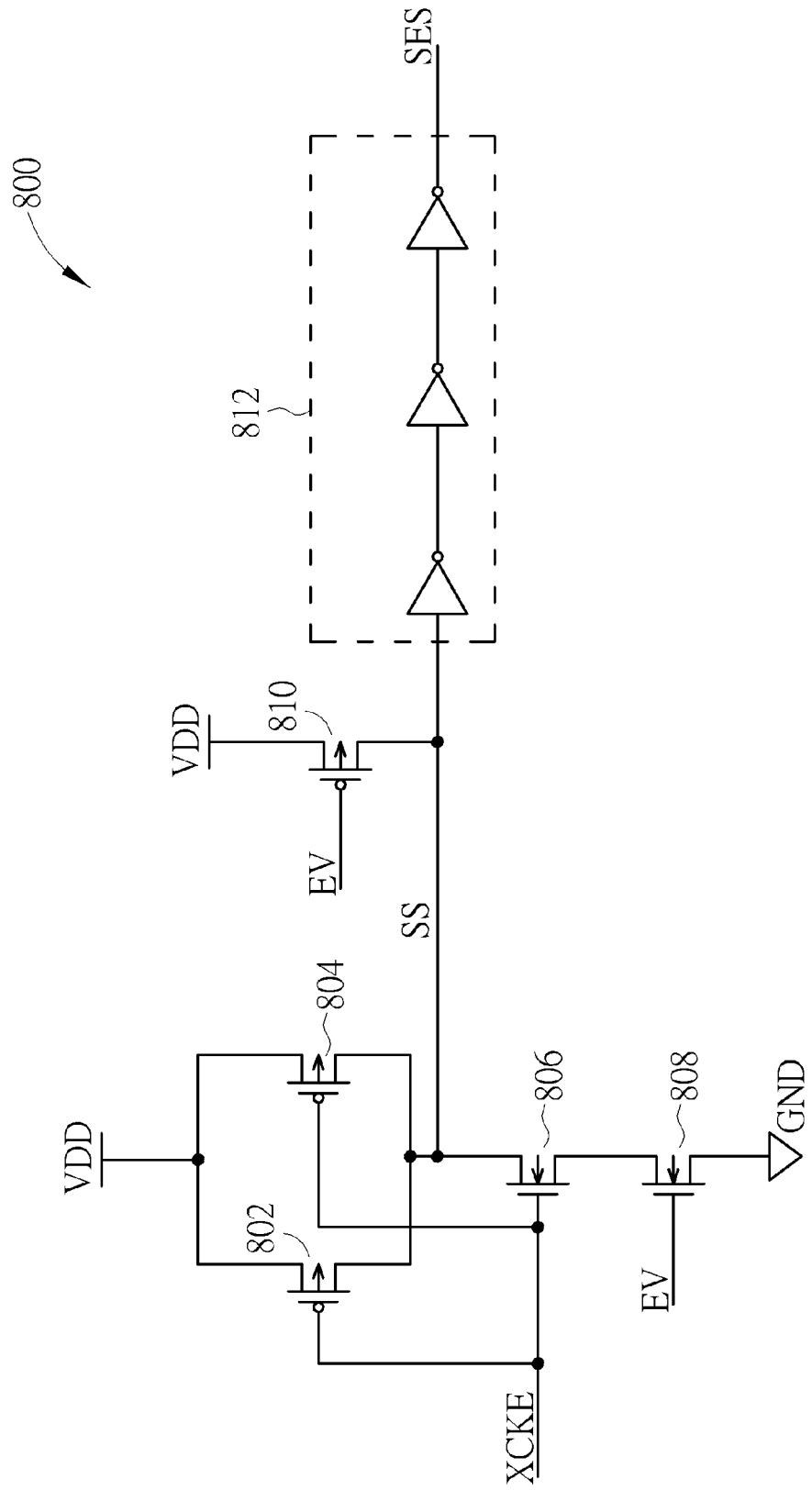
FIG. 8 is a diagram illustrating a second input receiving unit according to another embodiment.
Figure 9:
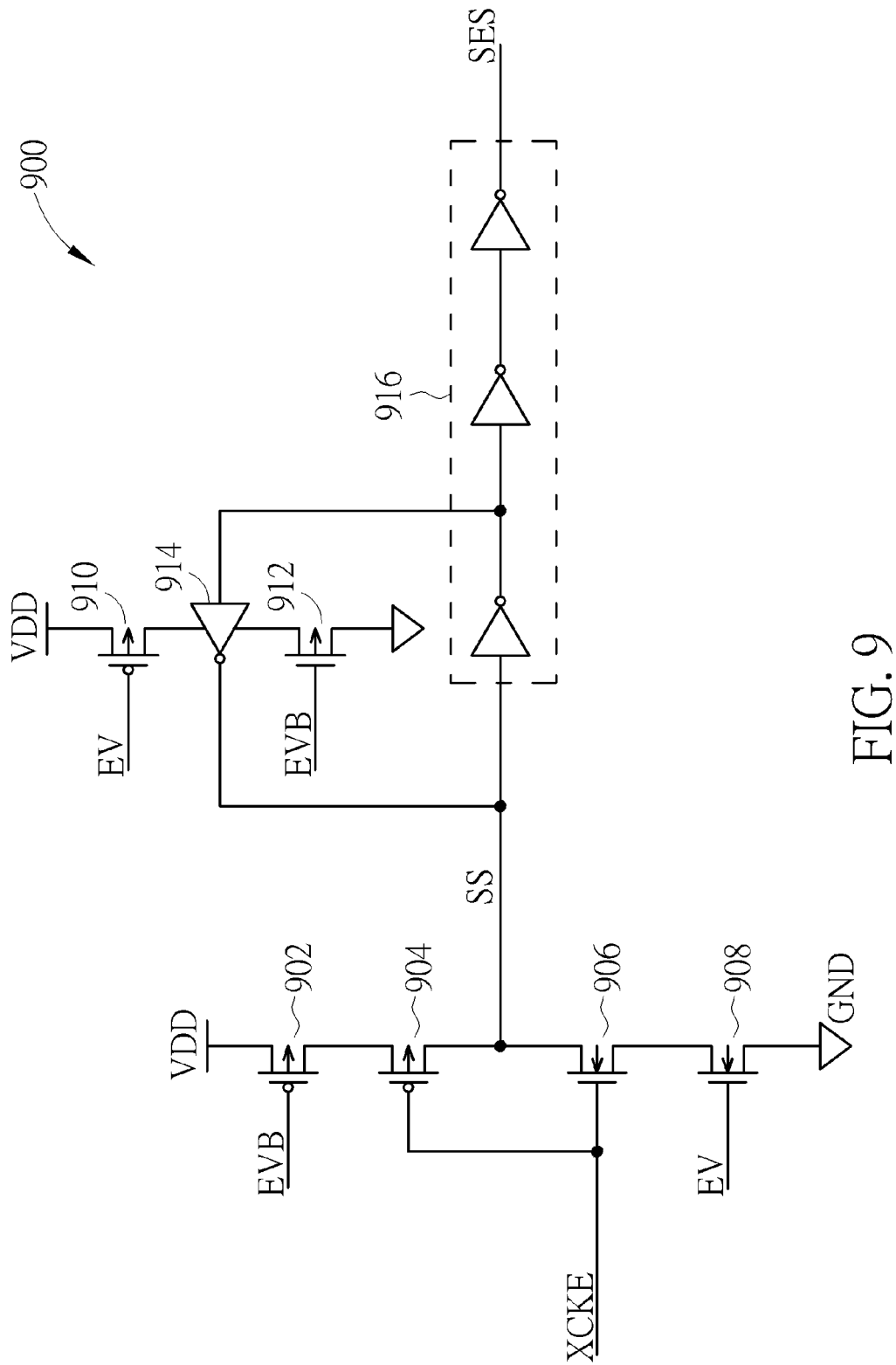
FIG. 9 is a diagram illustrating a second input receiving unit according to another embodiment.
Figure 10:
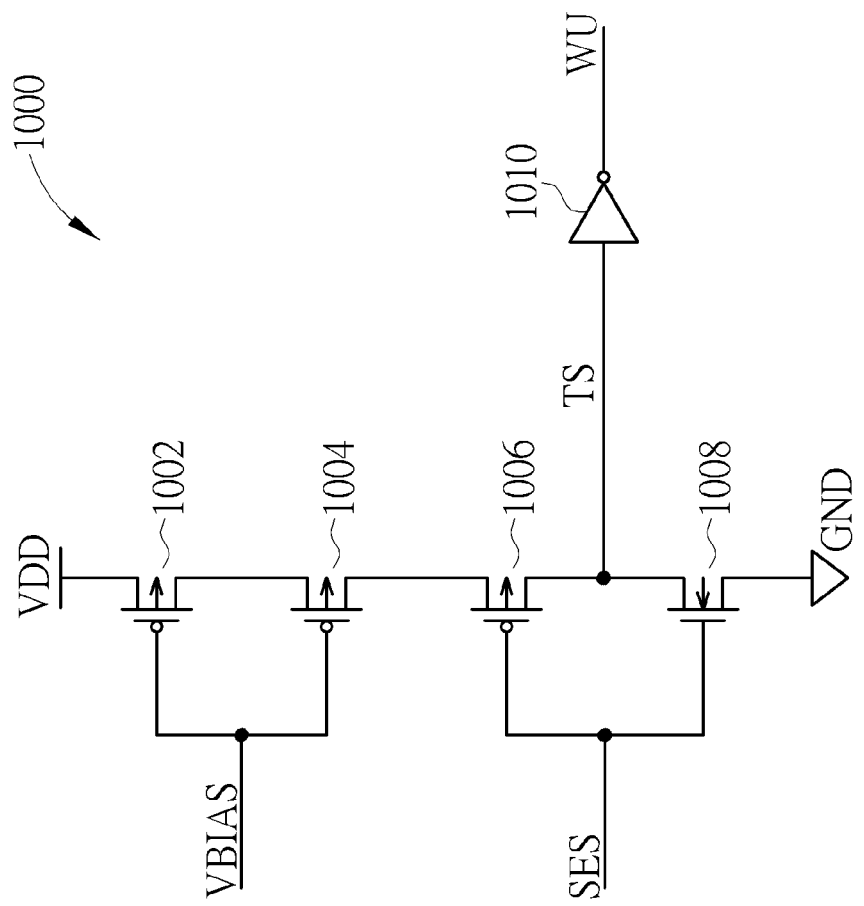
FIG. 10 is a diagram illustrating a delay unit according to another embodiment.
Figure 11:
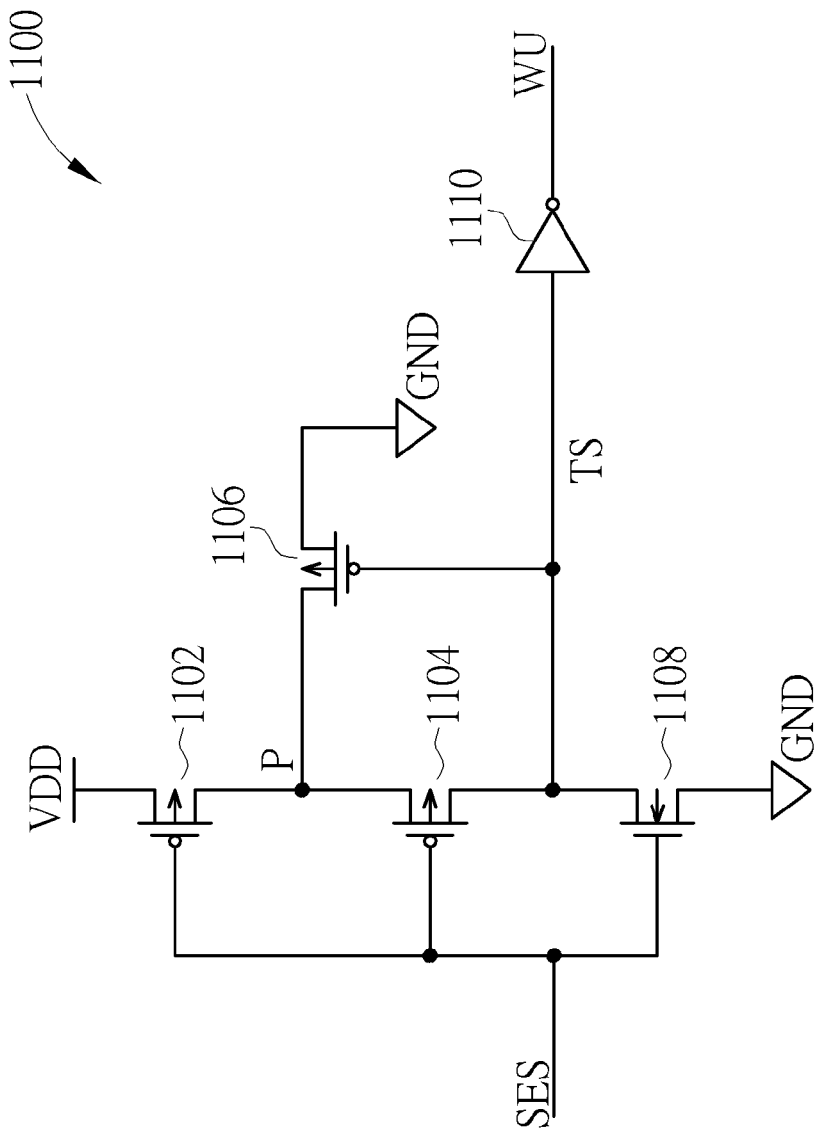
FIG. 11 is a diagram illustrating a delay unit according to another embodiment.

Please refer to FIG. 6 to FIG. 11. FIG. 6 is a diagram illustrating a first input receiving unit 600 according to another embodiment, FIG. 7 is a diagram illustrating a first input receiving unit 700 according to another embodiment, FIG. 8 is a diagram illustrating a second input receiving unit 800 according to another embodiment, FIG. 9 is a diagram illustrating a second input receiving unit 900 according to another embodiment, FIG. 10 is a diagram illustrating a delay unit 1000 according to another embodiment, and FIG. 11 is a diagram illustrating a delay unit 1100 according to another embodiment.

As shown in FIG. 6, the first input receiving unit 600 includes a first P-type metal-oxide-semiconductor transistor 602, a second P-type metal-oxide-semiconductor transistor 604, a first N-type metal-oxide-semiconductor transistor 606, a second N-type metal-oxide-semiconductor transistor 608, a third N-type metal-oxide-semiconductor transistor 610, a third P-type metal-oxide-semiconductor transistor 612, and an inner logic unit 614. As shown in FIG. 6, because the first P-type metal-oxide-semiconductor transistor 602 and the second P-type metal-oxide-semiconductor transistor 604 act as a differential pair, the first input receiving unit 600 can make the first enable signal FES follow the variation of the external clock enable signal XCKE when the wake-up signal WU is high. That is to say, when the wake-up signal WU is high and the external clock enable signal XCKE is high, the first enable signal FES is high; and when the wake-up signal WU is high and the external clock enable signal XCKE is low, the first enable signal FES is low. In addition, when the wake-up signal WU is low, the differential pair composed of the first P-type metal-oxide-semiconductor transistor 602 and the second P-type metal-oxide-semiconductor transistor 604 is turned off and the third P-type metal-oxide-semiconductor transistor 612 is turned on, resulting in a first signal FS being pulled up to a first voltage VDD. Meanwhile, the first input receiving unit 600 can keep the first enable signal FES low. In addition, the inner logic unit 614 is the same as the inner logic unit 2034, so further description thereof is omitted for simplicity.

As shown in FIG. 7, the first input receiving unit 700 includes a first P-type metal-oxide-semiconductor transistor 702, a second P-type metal-oxide-semiconductor transistor 704, a first N-type metal-oxide-semiconductor transistor 706, a second N-type metal-oxide-semiconductor transistor 708, a third N-type metal-oxide-semiconductor transistor 710, a third P-type metal-oxide-semiconductor transistor 712, and an inner logic unit 714. As shown in FIG. 7, because the first N-type metal-oxide-semiconductor transistor 706 and the second N-type metal-oxide-semiconductor transistor 708 act as a differential pair, the first input receiving unit 700 can make the first enable signal FES follow the variation of the external clock enable signal XCKE when the wake-up signal WU is high. In addition, when the wake-up signal WU is low, the differential pair composed of the first N-type metal-oxide-semiconductor transistor 706 and the second N-type metal-oxide-semiconductor transistor 708 is turned off and the third P-type metal-oxide-semiconductor transistor 712 is turned on, resulting in first signal FS being pulled up to the first voltage VDD. Meanwhile, the first input receiving unit 700 can keep the first enable signal FES low. In addition, the inner logic unit 714 is the same as the inner logic unit 2034, so further description thereof is omitted for simplicity.

As shown in FIG. 8, the second input receiving unit 800 includes a first P-type metal-oxide-semiconductor transistor 802, a second P-type metal-oxide-semiconductor transistor 804, a first N-type metal-oxide-semiconductor transistor 806, a second N-type metal-oxide-semiconductor transistor 808, a third P-type metal-oxide-semiconductor transistor 810, and an inner logic unit 812. As shown in FIG. 8, because the first P-type metal-oxide-semiconductor transistor 802, the second P-type metal-oxide-semiconductor transistor 804, and the first N-type metal-oxide-semiconductor transistor 806 act as an inverter, the second input receiving unit 800 can make the second enable signal SES follow the variation of the external clock enable signal XCKE when the enable voltage EV is high. That is to say, when the enable voltage EV is high and the external clock enable signal XCKE is high, the second enable signal SES is high; and when the enable voltage EV is high and the external clock enable signal XCKE is low, the second enable signal SES is low. In addition, when the enable voltage EV is low, the inverter composed of the first P-type metal-oxide-semiconductor transistor 802, the second P-type metal-oxide-semiconductor transistor 804, and the first N-type metal-oxide-semiconductor transistor 806 is turned off and the third P-type metal-oxide-semiconductor transistor 810 is turned on, resulting in the second signal SS being pulled up to the first voltage VDD. Meanwhile, the second input receiving unit 800 can make the second enable signal SES keep low. In addition, because the enable voltage EV is used for making the second input receiving unit 800 always be turned on, the enable voltage EV can also be equal to the first voltage VDD in another embodiment of the present invention. In addition, the inner logic unit 812 is the same as the inner logic unit 2034, so further description thereof is omitted for simplicity.

As shown in FIG. 9, the second input receiving unit 900 includes a first P-type metal-oxide-semiconductor transistor 902, a second P-type metal-oxide-semiconductor transistor 904, a first N-type metal-oxide-semiconductor transistor 906, a second N-type metal-oxide-semiconductor transistor 908, a third P-type metal-oxide-semiconductor transistor 910, a third N-type metal-oxide-semiconductor transistor 912, an inverter 914, and an inner logic unit 916. As shown in FIG. 9, because the second P-type metal-oxide-semiconductor transistor 904 and the first N-type metal-oxide-semiconductor transistor 906 act as an inverter, the second input receiving unit 900 can make the second enable signal SES follow the variation of the external clock enable signal XCKE when an enable voltage EV is high. In addition, when the enable voltage EV is low, the inverter composed of the second P-type metal-oxide-semiconductor transistor 904 and the first N-type metal-oxide-semiconductor transistor 906 is turned off. Meanwhile, the inverter 914 and the inner logic unit 916 can make the second enable signal SES keep a previous state of the second enable signal SES. In addition, because the enable voltage EV is used for making the second input receiving unit 900 always be turned on, the enable voltage EV can also be equal to the first voltage VDD in another embodiment of the present invention.

As shown in FIG. 10, the delay unit 1000 includes a first P-type metal-oxide-semiconductor transistor 1002, a second P-type metal-oxide-semiconductor transistor 1004, a third P-type metal-oxide-semiconductor transistor 1006, a first N-type metal-oxide-semiconductor transistor 1008, and a first inverter 1010. The first P-type metal-oxide-semiconductor transistor 1002 has a first terminal for receiving the first voltage VDD, a second terminal for receiving a bias VBIAS, and a third terminal. The second P-type metal-oxide-semiconductor transistor 1004 has a first terminal coupled to the third terminal of the first P-type metal-oxide-semiconductor transistor 1002, a second terminal for receiving the bias VBIAS, and a third terminal. The third P-type metal-oxide-semiconductor transistor 1006 has a first terminal coupled to the third terminal of the second P-type metal-oxide-semiconductor transistor 1004, a second terminal for receiving the second enable signal SES, and a third terminal for outputting a third signal TS. The first N-type metal-oxide-semiconductor transistor 1008 has a first terminal coupled to the third terminal of the third P-type metal-oxide-semiconductor transistor 1006, a second terminal for receiving the second enable signal SES, and a third terminal coupled to ground GND. The first inverter 1010 has a first terminal coupled to the third terminal of the third P-type metal-oxide-semiconductor transistor 1006, and a second terminal for outputting the wake-up signal WU. As shown in FIG. 10, the bias VBIAS is used for keeping the first P-type metal-oxide-semiconductor transistor 1002 and the second P-type metal-oxide-semiconductor transistor 1004 turning-on. When the second enable signal SES is changed from high to low, the third P-type metal-oxide-semiconductor transistor 1006 is gradually turned on and the first N-type metal-oxide-semiconductor transistor 1008 is gradually turned off, resulting in the third signal TS being changed from low to high; and when the second enable signal SES is changed from low to high, the first N-type metal-oxide-semiconductor transistor 1008 is gradually turned on and the third P-type metal-oxide-semiconductor transistor 1006 is gradually turned off, resulting in the third signal TS being changed from high to low. Because discharge capability of the first N-type metal-oxide-semiconductor transistor 1008 is stronger than charge capability of the third P-type metal-oxide-semiconductor transistor 1006, time for the third signal TS from low to high is longer than time for the third signal TS from high to low. That is to say, when the second enable signal SES is changed from high to low, the variation of the wake-up signal WU lags the variation of the second enable signal SES for a predetermined time. That is to say, the variation of the wake-up signal WU also lags the variation of the first enable signal FES for the predetermined time. When the second enable signal SES is changed from low to high, the variation of the wake-up signal WU synchronizes with the variation of the second enable signal SES. That is to say, the variation of the wake-up signal WU also synchronizes with the variation of the first enable signal FES.

As shown in FIG. 11, the delay unit 1100 includes a first P-type metal-oxide-semiconductor transistor 1102, a second P-type metal-oxide-semiconductor transistor 1104, a third P-type metal-oxide-semiconductor transistor 1106, a first N-type metal-oxide-semiconductor transistor 1108, and a first inverter 1110. The first P-type metal-oxide-semiconductor transistor 1102 has a first terminal for receiving the first voltage VDD, a second terminal for receiving the second enable signal SES, and a third terminal. The second P-type metal-oxide-semiconductor transistor 1104 has a first terminal coupled to the third terminal of the first P-type metal-oxide-semiconductor transistor 1102, a second terminal for receiving the second enable signal SES, and a third terminal for outputting a third signal TS. The third P-type metal-oxide-semiconductor transistor 1106 has a first terminal coupled to the third terminal of the first P-type metal-oxide-semiconductor transistor 1102, a second terminal coupled to the third terminal of the second P-type metal-oxide-semiconductor transistor 1104, and a third terminal coupled to ground GND. The first N-type metal-oxide-semiconductor transistor 1108 has a first terminal coupled to the third terminal of the second P-type metal-oxide-semiconductor transistor 1104, a second terminal for receiving the second enable signal SES, and a third terminal coupled to the ground GND. The first inverter 1110 has a first terminal coupled to the third terminal of the second P-type metal-oxide-semiconductor transistor 1104, and a second terminal for outputting the wake-up signal WU. As shown in FIG. 11, when the second enable signal SES is changed from high to low, potential of a node P is changed from low to high and the third signal TS is gradually changed from low to high. Therefore, the third P-type metal-oxide-semiconductor transistor 1106 can be turned on for a short time to make variation of the third signal TS lag the variation of the second enable signal SES for a predetermined time. That is to say, the variation of the wake-up signal WU lags the variation of the second enable signal SES for the predetermined time. When the second enable signal SES is changed from low to high, the potential of the node P is changed from high to low and the third signal TS is gradually changed from high to low. Therefore, the third P-type metal-oxide-semiconductor transistor 1106 can not be turned on to make the variation of the third signal TS synchronize with the variation of the second enable signal SES. That is to say, the variation of the wake-up signal WU synchronizes with the variation of the second enable signal SES.

Figure 12:
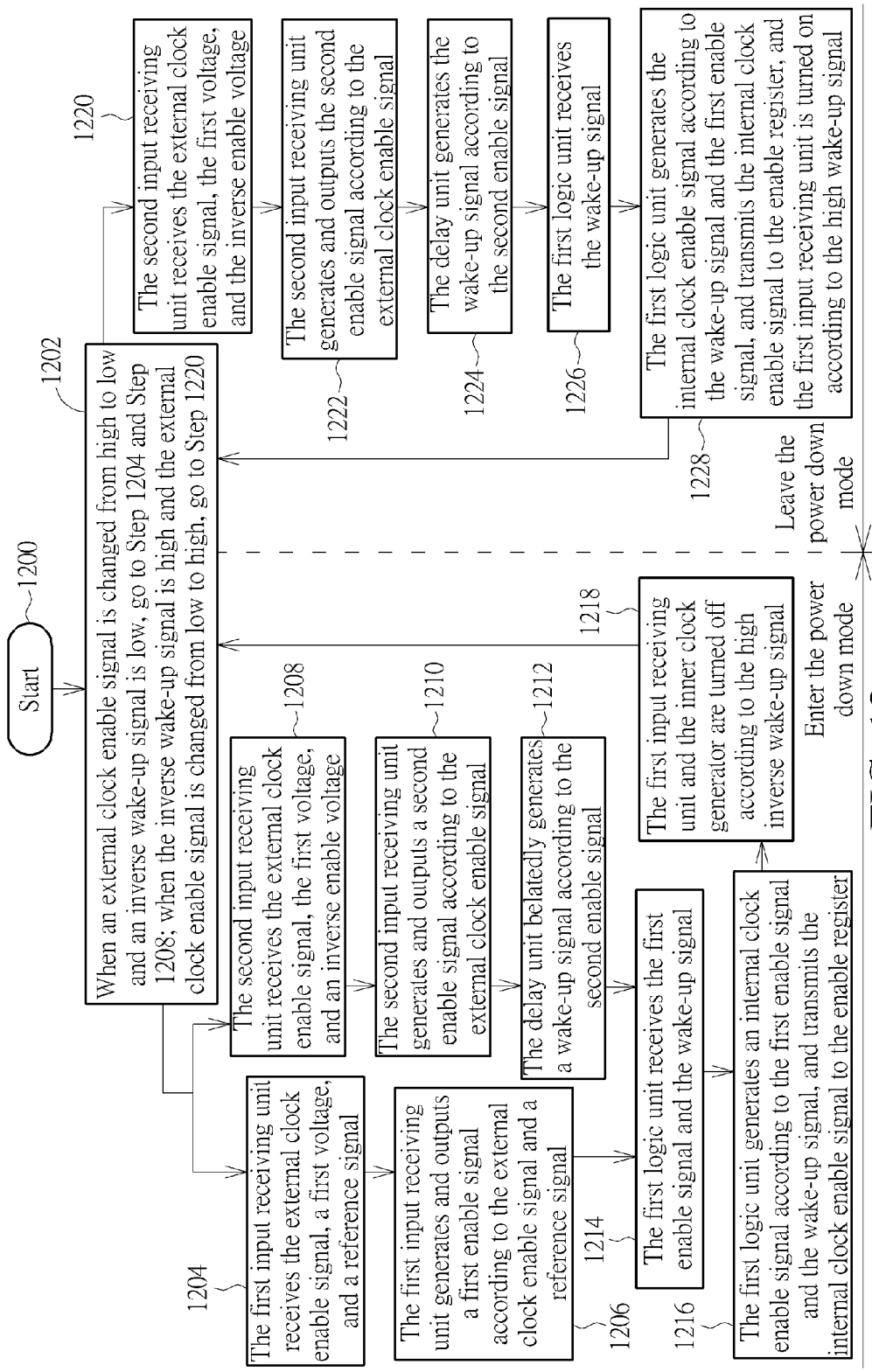
FIG. 12 is a flowchart illustrating an operation method of an input receiver according to another embodiment.

Please refer to FIG. 12, FIG. 2, FIG. 3, FIG. 4, and FIG. 5. FIG. 12 is a flowchart illustrating an operation method of an input receiver according to another embodiment. The method in FIG. 12 is illustrated using the input receiver 200 in FIG. 2. Detailed steps are as follows:

Step 1200: Start.

Step 1202: When an external clock enable signal XCKE is changed from high to low and an inverse wake-up signal WUB is low, go to Step 1204 and Step 1208; when the inverse wake-up signal WUB is high and the external clock enable signal XCKE is changed from low to high, go to Step 1220.

Step 1204: The first input receiving unit 202 receives the external clock enable signal XCKE, a first voltage VDD, and a reference signal VREF, go to Step 1206.

Step 1206: The first input receiving unit 202 generates and outputs a first enable signal FES according to the external clock enable signal XCKE and a reference signal VREF, go to Step 1214.

Step 1208: The second input receiving unit 204 receives the external clock enable signal XCKE, the first voltage VDD, and an inverse enable voltage EVB, go to Step 1210.

Step 1210: The second input receiving unit 204 generates and outputs a second enable signal SES according to the external clock enable signal XCKE, go to Step 1212.

Step 1212: The delay unit 206 belatedly generates a wake-up signal WU according to the second enable signal SES, go to Step 1214.

Step 1214: The first logic unit 208 receives the first enable signal FES and the wake-up signal WU, go to Step 1216.

Step 1216: The first logic unit 208 generates an internal clock enable signal ICKE according to the first enable signal FES and the wake-up signal WU, and transmits the internal clock enable signal ICKE to the enable register 210, go to Step 1218.

Step 1218: The first input receiving unit 202 and the inner clock generator 216 are turned off according to the high inverse wake-up signal WUB, go to Step 1202.

Step 1220: The second input receiving unit 204 receives the external clock enable signal XCKE, the first voltage VDD, and the inverse enable voltage EVB, go to Step 1222.

Step 1222: The second input receiving unit 204 generates and outputs the second enable signal SES according to the external clock enable signal XCKE, go to Step 1224.

Step 1224: The delay unit 206 generates the wake-up signal WU according to the second enable signal SES, go to Step 1226.

Step 1226: The first logic unit 208 receives the wake-up signal WU, go to Step 1228.

Step 1228: The first logic unit 208 generates the internal clock enable signal ICKE according to the wake-up signal WU and the first enable signal FES, and transmits the internal clock enable signal ICKE to the enable register 210, and the first input receiving unit 202 is turned on according to the high wake-up signal WU, go to Step 1202.

In Step 1206, as shown in FIG. 3, because the first N-type metal-oxide-semiconductor transistor 2028 and the second N-type metal-oxide-semiconductor transistor 2030 act as a differential pair, when the inverse wake-up signal WUB is low, the first input receiving unit 202 can generate and output the first enable signal FES following variation of the external clock enable signal XCKE. Meanwhile, the first enable signal FES is low. In Step 1208, because the enable voltage EV is used for making the second input receiving unit 204 always be turned on, the enable voltage EV can also be equal to the first voltage VDD in another embodiment of the present invention. In Step 1210, as shown in FIG. 4, because the second P-type metal-oxide-semiconductor transistor 2044, the first N-type metal-oxide-semiconductor transistor 2046, and the second N-type metal-oxide-semiconductor transistor 2048 act as an inverter, when the inverse enable voltage EVB is low, the second input receiving unit 204 can generate and output the second enable signal SES following the variation of the external clock enable signal XCKE. Meanwhile, the second enable signal SES is low. In Step 1212 and Step 1224, as shown in FIG. 5, variation of the wake-up signal WU generated by the delay unit 206 lags variation of the second enable signal SES for a predetermined time only when the second enable signal SES is changed from high to low. That is to say, the variation of the wake-up signal WU also lags the variation of the first enable signal FES for the predetermined time. In addition, the variation of the wake-up signal WU generated by the delay unit 206 can synchronize with the variation of the second enable signal SES delay unit 206 during other variation of the second enable signal SES. That is to say, the variation of the wake-up signal WU can synchronize with the variation of the first enable signal FES during other variation of the second enable signal SES. In Step 1216, as shown in FIG. 2, the first logic unit 208 can immediately generate and output the low internal clock enable signal ICKE to the enable register 210 according to the low first enable signal FES. Therefore, the enable register 210 can keep a latch clock enable signal LCKE outputted thereof low according to an inner clock ICLK, resulting in the system buffer (e.g. the clock buffer, the address buffer, the command buffer, or the data buffer of the dynamic random access memory) receiving the latch clock enable signal LCKE being turned off. That is to say, the system enters the power down mode. In Step 1218, the low wake-up signal WU can turn off the first input receiving unit 202 and the inner clock generator 216. Therefore, the system can save more power during the system entering the power down mode. Meanwhile, as shown in FIG. 3, the first enable signal FES is high because the third N-type metal-oxide-semiconductor transistor 2032 is turned on. In Step 1222, as shown in FIG. 4, because the inverse enable voltage EVB is low, the second input receiving unit 204 can generate and output the second enable signal SES following the variation of the external clock enable signal XCKE. Meanwhile, the second enable signal SES is high. In Step 1224, the delay unit 206 can immediately generate the high wake-up signal WU according to the high second enable signal SES. In Step 1228, the first logic unit 208 can immediately generate and output the high internal clock enable signal ICKE to the enable register 210 according to the high wake-up signal WU. Therefore, the enable register 210 can keep the latch clock enable signal LCKE outputted thereof high according to the inner clock ICLK, resulting in the system buffer receiving the latch clock enable signal LCKE being turned on. That is to say, the system leaves the power down mode.

To sum up, the input receiver and the operation method thereof have advantages as follows: first, after the present invention enters the power down mode, because the first input receiving unit and the inner clock generator can be turned off, and the second input receiving unit has low power consumption, compared to the prior art, power consumption of the present invention is lower; second, when the present invention enters the power down mode, because of the delay of the second enable signal, the output of the first logic unit is determined by the first enable signal, and this characteristic makes the present invention has a good setup time, a good hold time and better noise immunity while entering power down mode; third, when the present invention leaves the power down mode, because the first input receiving unit can be quickly changed from turning-off to turning-on, the internal clock enable signal outputted by the present invention has shorter response time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An input receiver, comprising:
    a first input receiving unit for receiving an inverse wake-up signal, an external clock enable signal, a first voltage, and a reference signal, and generating and outputting a first enable signal according to the external clock enable signal and the reference signal;
    a second input receiving unit for receiving the external clock enable signal, the first voltage, and an inverse enable voltage, and generating and outputting a second enable signal according to the external clock enable signal;
    a delay unit coupled to the second input receiving unit for generating a wake-up signal according to the second enable signal; and
    a first logic unit coupled to the first input receiving unit and the delay unit for receiving the first enable signal and the wake-up signal, and generating an internal clock enable signal according to the first enable signal and the wake-up signal.

2. The input receiver of claim 1, wherein when the second enable signal is changed from high to low, variation of the wake-up signal lags variation of the first enable signal for a predetermined time; and when the second enable signal is changed from low to high, the variation of the wake-up signal synchronizes with the variation of the first enable signal.

3. The input receiver of claim 1, wherein the inverse wake-up signal is generated by the wake-up signal passing a second logic unit.

4. The input receiver of claim 1, wherein when the external clock enable signal is low, the wake-up signal is used for turning off an inner clock generator, and the inverse wake-up signal is used for turning off the first input receiving unit.

5. The input receiver of claim 4, wherein the internal clock enable signal is transmitted to an enable register, and a clock generated by the inner clock generator is transmitted to the enable register.

6. The input receiver of claim 1, wherein the first input receiving unit comprises:
    a first P-type metal-oxide-semiconductor transistor having a first terminal for receiving the first voltage, a second terminal for receiving the inverse wake-up signal, and a third terminal;
    a second P-type metal-oxide-semiconductor transistor having a first terminal coupled to the third terminal of the first P-type metal-oxide-semiconductor transistor, a second terminal, and a third terminal coupled to the second terminal of the second P-type metal-oxide-semiconductor transistor;
    a third P-type metal-oxide-semiconductor transistor having a first terminal coupled to the third terminal of the first P-type metal-oxide-semiconductor transistor, a second terminal coupled to the second terminal of the second P-type metal-oxide-semiconductor transistor, and a third terminal for outputting a first signal;
    a first N-type metal-oxide-semiconductor transistor having a first terminal coupled to the third terminal of the second P-type metal-oxide-semiconductor transistor, a second terminal for receiving the reference signal, and a third terminal coupled to ground;
    a second N-type metal-oxide-semiconductor transistor having a first terminal coupled to the third terminal of the third P-type metal-oxide-semiconductor transistor, a second terminal for receiving the external clock enable signal, and a third terminal coupled to the ground;
    a third N-type metal-oxide-semiconductor transistor having a first terminal coupled to the third terminal of the third P-type metal-oxide-semiconductor transistor, a second terminal for receiving the inverse wake-up signal, and a third terminal coupled to the ground; and
    an inner logic unit having a first terminal coupled to the third terminal of the third P-type metal-oxide-semiconductor transistor for receiving the first signal, and a second terminal for outputting the first enable signal, wherein the inner logic unit is used for reversing the first signal to generate and output the first enable signal.

7. The input receiver of claim 6 wherein the inner logic unit comprises:
    a first inverter having a first terminal coupled to the third terminal of the third P-type metal-oxide-semiconductor transistor for receiving the first signal, and a second terminal;
    a second inverter having a first terminal coupled to the second terminal of the first inverter, and a second terminal; and
    a third inverter having a first terminal coupled to the second terminal of the second inverter, and a second terminal for outputting the first enable signal.

8. The input receiver of claim 1, wherein the first input receiving unit comprises:
    a first P-type metal-oxide-semiconductor transistor having a first terminal for receiving the first voltage, a second terminal for receiving the reference signal, and a third terminal;
    a second P-type metal-oxide-semiconductor transistor having a first terminal for receiving the first voltage, a second terminal for receiving the external clock enable signal, and a third terminal for outputting a first signal;
    a first N-type metal-oxide-semiconductor transistor having a first terminal coupled to the third terminal of the first P-type metal-oxide-semiconductor transistor, a second terminal coupled to the first terminal of the first N-type metal-oxide-semiconductor transistor, and a third terminal;
    a second N-type metal-oxide-semiconductor transistor having a first terminal coupled to the third terminal of the second P-type metal-oxide-semiconductor transistor, a second terminal coupled to the second terminal of the first N-type metal-oxide-semiconductor transistor, and a third terminal coupled to the third terminal of the first N-type metal-oxide-semiconductor transistor;
    a third N-type metal-oxide-semiconductor transistor having a first terminal coupled to the third terminal of the first N-type metal-oxide-semiconductor transistor, a second terminal for receiving the wake-up signal, and a third terminal coupled to ground;
    a third P-type metal-oxide-semiconductor transistor having a first terminal for receiving the first voltage, a second terminal for receiving the wake-up signal, and a third terminal coupled to the third terminal of the second P-type metal-oxide-semiconductor transistor; and
    an inner logic unit having a first terminal coupled to the third terminal of the third P-type metal-oxide-semiconductor transistor for receiving the first signal, and a second terminal for outputting the first enable signal, wherein the inner logic unit is used for reversing the first signal to generate and output the first enable signal.

9. The input receiver of claim 8, wherein the inner logic unit comprises:

a first inverter having a first terminal coupled to the third terminal of the third P-type metal-oxide-semiconductor transistor for receiving the first signal, and a second terminal;

a second inverter having a first terminal coupled to the second terminal of the first inverter, and a second terminal; and a third inverter having a first terminal coupled to the second terminal of the second inverter, and a second terminal for outputting the first enable signal.

10. The input receiver of claim 1, wherein the first input receiving unit comprises:

a first P-type metal-oxide-semiconductor transistor having a first terminal for receiving the first voltage, a second terminal, and a third terminal;

a second P-type metal-oxide-semiconductor transistor having a first terminal for receiving the first voltage, a second terminal coupled to the third terminal of the first P-type metal-oxide-semiconductor transistor, and a third terminal coupled to the second terminal of the first P-type metal-oxide-semiconductor transistor for outputting a first signal;

a first N-type metal-oxide-semiconductor transistor having a first terminal coupled to the third terminal of the first P-type metal-oxide-semiconductor transistor, a second terminal for receiving the reference signal, and a third terminal;

a second N-type metal-oxide-semiconductor transistor having a first terminal coupled to the third terminal of the second P-type metal-oxide-semiconductor transistor, a second terminal for receiving the external clock enable signal, and a third terminal coupled to the third terminal of the first N-type metal-oxide-semiconductor transistor;

a third N-type metal-oxide-semiconductor transistor having a first terminal coupled to the third terminal of the first N-type metal-oxide-semiconductor transistor, a second terminal for receiving the wake-up signal, and a third terminal coupled to ground;

a third P-type metal-oxide-semiconductor transistor having a first terminal for receiving the first voltage, a second terminal for receiving the wake-up signal, and a third terminal coupled to the third terminal of the second P-type metal-oxide-semiconductor transistor; and an inner logic unit having a first terminal coupled to the third terminal of the third P-type metal-oxide-semiconductor transistor for receiving the first signal, and a second terminal for outputting the first enable signal, wherein the inner logic unit is used for reversing the first signal to generate and output the first enable signal.

11. The input receiver of claim 10, wherein the inner logic unit comprises:

a first inverter having a first terminal coupled to the third terminal of the third P-type metal-oxide-semiconductor transistor for receiving the first signal, and a second terminal;

a second inverter having a first terminal coupled to the second terminal of the first inverter, and a second terminal; and a third inverter having a first terminal coupled to the second terminal of the second inverter, and a second terminal for outputting the first enable signal.

12. The input receiver of claim 1, wherein the second input receiving unit comprises:

a first P-type metal-oxide-semiconductor transistor having a first terminal for receiving the first voltage, a second terminal for receiving the inverse enable voltage, and a third terminal;

a second P-type metal-oxide-semiconductor transistor having a first terminal coupled to the third terminal of the first P-type metal-oxide-semiconductor transistor, a second terminal for receiving the external clock enable signal, and a third terminal for outputting a second signal;

a first N-type metal-oxide-semiconductor transistor having a first terminal coupled to the third terminal of the second P-type metal-oxide-semiconductor transistor, a second terminal for receiving the external clock enable signal, and a third terminal coupled to ground;

a second N-type metal-oxide-semiconductor transistor having a first terminal coupled to the third terminal of the second P-type metal-oxide-semiconductor transistor, a second terminal for receiving the external clock enable signal, and a third terminal coupled to the ground;

a third N-type metal-oxide-semiconductor transistor having a first terminal coupled to the third terminal of the second P-type metal-oxide-semiconductor transistor, a second terminal for receiving the inverse enable voltage, and a third terminal coupled to the ground; and an inner logic unit having a first terminal coupled to the third terminal of the second P-type metal-oxide-semiconductor transistor for receiving the second signal, and a second terminal for outputting the second enable signal, wherein the inner logic unit is used for reversing the second signal to generate and output the second enable signal.

13. The input receiver of claim 12, wherein the inner logic unit comprises:

a first inverter having a first terminal for receiving the second signal, and a second terminal;

a second inverter having a first terminal coupled to the second terminal of the first inverter, and a second terminal; and a third inverter having a first terminal coupled to the second terminal of the second inverter, and a second terminal for outputting the second enable signal.

14. The input receiver of claim 1, wherein the second input receiving unit comprises:

a first P-type metal-oxide-semiconductor transistor having a first terminal for receiving the first voltage, a second terminal for receiving the external clock enable signal, and a third terminal;

a second P-type metal-oxide-semiconductor transistor having a first terminal for receiving the first voltage, a second terminal for receiving the external clock enable signal, and a third terminal coupled to the third terminal of the first P-type metal-oxide-semiconductor transistor for outputting a second signal;

a first N-type metal-oxide-semiconductor transistor having a first terminal coupled to the third terminal of the second P-type metal-oxide-semiconductor transistor, a second terminal for receiving the external clock enable signal, and a third terminal;

a second N-type metal-oxide-semiconductor transistor having a first terminal coupled to the third terminal of the first N-type metal-oxide-semiconductor transistor, a second terminal for receiving the enable voltage, and a third terminal coupled to ground;

a third P-type metal-oxide-semiconductor transistor having a first terminal for receiving the first voltage, a second terminal for receiving the enable voltage, and a third terminal coupled to the third terminal of the second P-type metal-oxide-semiconductor transistor; and an inner logic unit having a first terminal coupled to the third terminal of the second P-type metal-oxide-semiconductor transistor for receiving the second signal, and a second terminal for outputting the second enable signal, wherein the inner logic unit is used for reversing the second signal to generate and output the second enable signal.

15. The input receiver of claim 14, wherein the inner logic unit comprises:

a first inverter having a first terminal for receiving the second signal, and a second terminal;

a second inverter having a first terminal coupled to the second terminal of the first inverter, and a second terminal; and a third inverter having a first terminal coupled to the second terminal of the second inverter, and a second terminal for outputting the second enable signal.

16. The input receiver of claim 1, wherein the second input receiving unit comprises:

a first P-type metal-oxide-semiconductor transistor having a first terminal for receiving the first voltage, a second terminal for receiving the inverse enable voltage, and a third terminal;

a second P-type metal-oxide-semiconductor transistor having a first terminal coupled to the third terminal of the first P-type metal-oxide-semiconductor transistor, a second terminal for receiving the external clock enable signal, and a third terminal for outputting a second signal;

a first N-type metal-oxide-semiconductor transistor having a first terminal coupled to the third terminal of the second P-type metal-oxide-semiconductor transistor, a second terminal for receiving the external clock enable signal, and a third terminal;

a second N-type metal-oxide-semiconductor transistor having a first terminal coupled to the third terminal of the first N-type metal-oxide-semiconductor transistor, a second terminal for receiving the enable voltage, and a third terminal coupled to ground;

a third P-type metal-oxide-semiconductor transistor having a first terminal for receiving the first voltage, a second terminal for receiving the enable voltage, and a third terminal coupled to an inverter;

a third N-type metal-oxide-semiconductor transistor having a first terminal coupled to the inverter, a second terminal for receiving the inverse enable voltage, and a third terminal coupled to the ground; and an inner logic unit having a first terminal coupled to the third terminal of the second P-type metal-oxide-semiconductor transistor for receiving the second signal, and a second terminal for outputting the second enable signal, wherein the inner logic unit is used for reversing the second signal to generate and output the second enable signal;

wherein the inverter is further coupled to the third terminal of the second P-type metal-oxide-semiconductor transistor and the inner logic unit.

17. The input receiver of claim 16, wherein the inner logic unit comprises:

a first inverter having a first terminal for receiving the second signal, and a second terminal;

a second inverter having a first terminal coupled to the second terminal of the first inverter, and a second terminal; and a third inverter having a first terminal coupled to the second terminal of the second inverter, and a second terminal for outputting the second enable signal.

18. The input receiver of claim 1, wherein the delay unit comprises:

a first inverter having a first terminal coupled to the second input receiving unit for receiving the second enable signal, and a second terminal;

a first P-type metal-oxide-semiconductor transistor having a first terminal for receiving the first voltage, a second terminal coupled to the second terminal of the first inverter, and a third terminal coupled to the first terminal of the first P-type metal-oxide-semiconductor transistor;

a second P-type metal-oxide-semiconductor transistor having a first terminal for receiving the first voltage, a second terminal coupled to the second terminal of the first inverter, and a third terminal coupled to the first terminal of the second P-type metal-oxide-semiconductor transistor; and a second inverter having a first terminal coupled to the second terminal of the first inverter, and a second terminal for outputting the wake-up signal.

19. The input receiver of claim 1, wherein the delay unit comprises:

a first P-type metal-oxide-semiconductor transistor having a first terminal for receiving the first voltage, a second terminal for receiving a bias, and a third terminal;

a second P-type metal-oxide-semiconductor transistor having a first terminal coupled to the third terminal of the first P-type metal-oxide-semiconductor transistor, a second terminal for receiving the bias, and a third terminal;

a third P-type metal-oxide-semiconductor transistor having a first terminal coupled to the third terminal of the second P-type metal-oxide-semiconductor transistor, a second terminal for receiving the second enable signal, and a third terminal;

a first N-type metal-oxide-semiconductor transistor having a first terminal coupled to the third terminal of the third P-type metal-oxide-semiconductor transistor, a second terminal for receiving the second enable signal, and a third terminal, coupled to ground; and a first inverter having a first terminal coupled to the third terminal of the third P-type metal-oxide-semiconductor transistor, and a second terminal for outputting the wake-up signal.

20. The input receiver of claim 1, wherein the delay unit comprises:

a first P-type metal-oxide-semiconductor transistor having a first terminal for receiving the first voltage, a second terminal for receiving the second enable signal, and a third terminal;

a second P-type metal-oxide-semiconductor transistor having a first terminal coupled to the third terminal of the first P-type metal-oxide-semiconductor transistor, a second terminal for receiving the second enable signal, and a third terminal;

a third P-type metal-oxide-semiconductor transistor having a first terminal coupled to the third terminal of the first P-type metal-oxide-semiconductor transistor, a second terminal coupled to the third terminal of the second P-type metal-oxide-semiconductor transistor, and a third terminal coupled to ground;

a first N-type metal-oxide-semiconductor transistor having a first terminal coupled to the third terminal of the second P-type metal-oxide-semiconductor transistor, a second terminal for receiving the second enable signal, and a third terminal coupled to the ground; and a first inverter having a first terminal coupled to the third terminal of the second P-type metal-oxide-semiconductor transistor, and a second terminal for outputting the wake-up signal.

21. The input receiver of claim 1, wherein the inverse enable voltage is generated by the enable voltage passing a third logic unit.

22. The input receiver of claim 1, wherein the first logic unit comprises:
    an NAND gate having a first terminal coupled to the first input receiving unit for receiving the first enable signal, a second terminal coupled to the delay unit for receiving the wake-up signal, and a third terminal; and
    an inverter having a first terminal coupled to the third terminal of the NAND gate, and a second terminal for outputting the internal clock enable signal.

23. An operation method of an input receiver, the input receiver comprising a first input receiving unit, a second input receiving unit, a delay unit, and a first logic unit, the operation method comprising:
    the second input receiving unit receiving an external clock enable signal, a first voltage, and an inverse enable voltage, wherein the external clock enable signal is changed from low to high;
    the second input receiving unit generating and outputting a second enable signal according to the external clock enable signal;
    the delay unit generating a wake-up signal according to the second enable signal;
    the first input receiving unit being turned on according to the inverse wake-up signal;
    the first logic unit receiving the wake-up signal and a first enable signal; and
    the first logic unit generating an internal clock enable signal according to the wake-up signal and the first enable signal.

24. The operation method of claim 23, further comprising:
    a second logic unit reversing the wake-up signal to generate the inverse wake-up signal.

25. The operation method of claim 23, wherein the inverse enable voltage is generated by an enable voltage passing a third logic unit.

26. The operation method of claim 23, further comprising:
    transmitting the internal clock enable signal to an enable register.

27. An operation method of an input receiver, the input receiver comprising a first input receiving unit, a second input receiving unit, a delay unit, and a first logic unit, the operation method comprising:
    the first input receiving unit receiving an external clock enable signal, a first voltage, an inverse wake-up signal, and a reference signal, wherein the external clock enable signal is changed from high to low;
    the first input receiving unit generating a first enable signal according to the external clock enable signal and the reference signal;
    the second input receiving unit receiving the external clock enable signal, the first voltage, and an inverse enable voltage;
    the second input receiving unit generating and outputting a second enable signal according to the external clock enable signal;
    the delay unit belatedly generating a wake-up signal according to the second enable signal;
    the first logic unit receiving the first enable signal and the wake-up signal;
    the first logic unit generating an internal clock enable signal according to the first enable signal and the wake-up signal; and
    the first input receiving unit being turned off according to the inverse wake-up signal.

28. The operation method of claim 27, further comprising:
    the wake-up signal turning off an inner clock generator.

29. The operation method of claim 27, further comprising:
    transmitting the internal clock enable signal to an enable register.

* * * * *